(12) United States Patent
Naim et al.

(10) Patent No.: US 10,388,492 B2
(45) Date of Patent: Aug. 20, 2019

(54) COATED SEMICONDUCTOR PROCESSING MEMBERS HAVING CHLORINE AND FLUORINE PLASMA EROSION RESISTANCE AND COMPLEX OXIDE COATINGS THEREFOR

(71) Applicant: FM Industries, Inc., Fremont, CA (US)

(72) Inventors: Mahmood Naim, Poughkeepsie, NY (US); David Hammerich, Fremont, CA (US)

(73) Assignee: FM Industries, Inc., Fremont, CA (US)

( * ) Notice: Subject to any disclaimer, the term of this patent is extended or adjusted under 35 U.S.C. 154(b) by 208 days.

(21) Appl. No.: 15/248,496

(22) Filed: Aug. 26, 2016

(65) Prior Publication Data

US 2017/0301519 A1    Oct. 19, 2017

Related U.S. Application Data

(60) Provisional application No. 62/322,411, filed on Apr. 14, 2016.

(51) Int. Cl.
| | |
|---|---|
| *H01J 37/32* | (2006.01) |
| *C23C 4/134* | (2016.01) |
| *C23C 4/11* | (2016.01) |
| *C23C 4/02* | (2006.01) |

(52) U.S. Cl.
CPC ......... *H01J 37/32495* (2013.01); *C23C 4/02* (2013.01); *C23C 4/11* (2016.01); *C23C 4/134* (2016.01)

(58) Field of Classification Search
None
See application file for complete search history.

(56) References Cited

U.S. PATENT DOCUMENTS

| | | |
|---|---|---|
| 4,419,201 A | 12/1983 | Levinstein et al. |
| 5,637,237 A | 6/1997 | Oehrlein et al. |
| 6,776,873 B1 | 8/2004 | Sun et al. |
| 7,494,723 B2 | 2/2009 | Harada et al. |
| 2006/0040508 A1 | 2/2006 | Ji et al. |
| 2006/0046450 A1* | 3/2006 | Narendar ............... C04B 35/16 438/585 |
| 2009/0208667 A1 | 8/2009 | Harada et al. |
| 2010/0272982 A1 | 10/2010 | Dickinson et al. |
| 2012/0001293 A1 | 1/2012 | Mohamed et al. |

(Continued)

FOREIGN PATENT DOCUMENTS

WO    2015/199752 A1    12/2015

OTHER PUBLICATIONS

International Search Report and Written Opinion, International Application No. PCT/US2017/023970, dated Jun. 21, 2017 (8 pages).

*Primary Examiner* — Adam Krupicka
(74) *Attorney, Agent, or Firm* — Burr & Brown, PLLC

(57) ABSTRACT

A semiconductor processing member is provided, including a body and a plasma spray coating provided on the body. The coating is an ABO or ABCO complex oxide solid solution composition, where A, B and C are selected from the group consisting of La, Zr, Ce, Gd, Y, Yb and Si, and O is an oxide. The coating imparts both chlorine and fluorine plasma erosion resistance, reduces particle generation during plasma etching, and prevents spalling of the coating during wet cleaning of the semiconductor processing member.

15 Claims, 6 Drawing Sheets

(56) References Cited

U.S. PATENT DOCUMENTS

| | | |
|---|---|---|
| 2012/0177908 A1 | 7/2012 | Petorak et al. |
| 2012/0196139 A1 | 8/2012 | Petorak et al. |
| 2013/0059071 A1 | 3/2013 | O'Donnell |
| 2013/0224498 A1 | 8/2013 | Sun et al. |
| 2015/0376760 A1 | 12/2015 | Naim et al. |

* cited by examiner

COATED SEMICONDUCTOR PROCESSING MEMBERS HAVING CHLORINE AND FLUORINE PLASMA EROSION RESISTANCE AND COMPLEX OXIDE COATINGS THEREFOR

FIELD OF THE INVENTION

This invention relates to semiconductor processing chambers or members operating with plasma assisted etching or deposition processes. More specifically, the invention relates to complex oxide coatings applied on vacuum and plasma chamber components to prevent particle generation, to provide dielectric protection, to provide wet clean resistance, to maintain a high purity environment for the creation of critical dimensions and features of semiconductor devices produced therein and to provide an extended life for the coated chamber components.

BACKGROUND OF THE INVENTION

Processing chambers used for making semiconductor devices involve deposition and etching processes performed in vacuum environments. These processes also require plasma chemistries to etch or deposit conductors and dielectric materials on various substrates (wafers). These wafers are mostly made of Si, but may also be made of GaAs or GaN. During such plasma processes, where plasma generated chemistries are directed towards a wafer by means of voltage biasing or electromagnetics, the walls and components of the processing chambers that surround a wafer are also exposed to those etching chemistries. The etching of material from the chamber walls and various components inside the vacuum chamber results in particle generation, which is undesirable. These particles can land on the wafers and result in damage to the critical submicron features and functionality of the semiconductor devices that that are being etched or deposited thereon. Currently, there is a growing need to make these submicron critical features smaller and smaller to make even denser semiconductor devices. These submicron features have critical dimensions, and the future generation of semiconductors is moving toward a critical size of the order of 20 nm and beyond. Such a reduction in the critical dimensions requires further reductions of particle generation inside these process chambers.

Particle generation from the chamber walls in a semiconductor chamber/member can lead to other problems, as well. The physical presence of eroded metallic particles in parts per million on a process wafer can also cause electrical shorting between two nearby conductors. In addition, if the generated particles diffuse into the wafer matrix, they can result in uncontrolled ion mobility, thereby causing the semiconductor device to malfunction. The success of these nanometer devices and the critical features thereof therefore require that the walls of the process chambers are protected from plasma erosion. And if walls are eroded, it is important that very few particles are released on to a wafer that could possibly cause any malfunctions of the formed devices.

One method of providing such protection from particle generation involves using thermal sprayed coatings that are resistant to plasma erosion. An initial approach to chamber wall protection focused on anodization, and thermal sprayed coatings made of $Al_2O_3$ became a material of choice. U.S. Pat. No. 4,419,201 discloses the use of $Al_2O_3$ coatings to resist erosion caused by chlorine plasma. U.S. Pat. No. 5,637,237 further discloses a plasma etch chamber where the chamber wall surfaces are coated with $Al_2O_3$, $Y_2O_3$ and $Sc_2O_3$ to reduce erosion of walls exposed to plasma. The recent introduction of aggressive, high density fluorine plasma results in the rapid etching of $Al_2O_3$ coated chamber walls and the generation of AlF particles. The AlF particles form dust inside the process chamber, have proven to be difficult to remove, and cause wafer-level defects in semiconductor devices.

$Y_2O_3$ coatings then became a material of choice, however, the use of $Y_2O_3$ coatings has also resulted in problems. That is, while yttria coatings have been successful in resisting fluorine plasma erosion, these coatings rapidly erode when exposed to chlorine plasma. Another drawback of yttria coatings is the delamination of these coatings when exposed to aqueous cleaning processes outside the semiconductor chambers. The presence of yttrium fluoride and yttrium oxyfluoride particles has also caused problems at the wafer-level. As a result, a number of publications and patents have addressed the need for improvements in yttria coatings to solve these various problems.

For example U.S. Pat. No. 6,776,873 discloses combining $Al_2O_3$ with $Y_2O_3$ to provide resistance to fluorine and oxygen plasma. U.S. Pat. No. 7,494,723 discloses a method of densifying a top layer of a $Y_2O_3$ coating with e-beam radiation to provide increased erosion resistance. U.S. patent application publication No. 2010/0272982 A1 describes the use of yttria stabilized zirconia coatings that provide plasma erosion resistance and wet cleaning resistance. U.S. Patent application publication No. 2012/0177908 A1 discloses the use of a porosity gradient in $Y_2O_3$ and $Zr_2O_3$ coatings to gain higher thermal resistance in addition to plasma resistance. U.S. patent application publication 2012/0196139 A1 describes a multilayer coating structure to gain plasma erosion resistance and wet cleaning resistance. U.S. patent application publication No. 2015/0376760 A1 and International Publication No. WO 2015/199752A1 disclose providing controlled emissivity coatings for chamber components to gain thermal enhancement and improved plasma erosion resistance.

However, all of these earlier solutions are based on the use of single oxide materials classified as AO, where A is a metal and O is the oxide; like $Al_2O_3$, $Y_2O_3$, $Ce_2O_3$, $Gd_2O_3$, $HfO_2$, $ZrO_2$, etc. As such, there is still a need to understand the benefits provided by the use of multicomponent, complex oxides with respect to improved resistance to plasma erosion and subsequent wet cleaning resistance to provide the next generation of productivity solutions for the semiconductor processing members.

The processes used in semiconductor chambers are also evolving and a new generation of coating materials is desired that can provide needed solutions beyond yttria. One of the needs is to have coating materials that can withstand both fluorine and chlorine plasma inside the chamber, thereby preventing particle generation. It is also desired that these materials should have sufficient dielectric strength to withstand the voltages present in a semiconductor process chamber. In addition to the plasma erosion resistance inside these vacuum tools, the coatings must also provide resistance to spallation and/or erosion when the components are later wet cleaned to remove materials deposited during various semiconductor etching or deposition processes.

To address the prevention of erosion of the semiconductor chamber components, the prior art has heretofore been focused on the use of single oxides, and no recognition has been made with respect to the use of complex oxides, where all of the oxides are in a solid solution and have a controlled purity of specific elements in ppm.

SUMMARY OF THE INVENTION

The present invention addresses the problem of plasma erosion resistance and subsequent particle generation for both the fluorine and chlorine based plasma, and also considers wet corrosion issues along with the control of specific elements in parts per million (ppm). In view of the above, the present invention provides plasma sprayed coatings for semiconductor chamber members made of complex oxides having the solid solution ABO and ABCO compositions, wherein A, B and C represent various metals and O represents oxides thereof.

According to a first aspect of the present invention, a semiconductor processing member is provided, comprising a body, and a plasma spray coating provided on the body. The coating is an ABO or ABCO complex oxide solid solution composition, where A, B and C are selected from the group consisting of La, Zr, Ce, Gd, Y, Yb and Si, and O is an oxide, whereby the coating imparts both chlorine and fluorine plasma erosion resistance, reduces particle generation during plasma etching, and prevents spalling of the coating during wet cleaning of the member.

Preferably, the coating is selected from the group consisting of $La_2Zr_2O_7$, $La_{1.5}Ce_{0.5}Zr_2O_7$, $Ce_{0.25}Zr_{0.75}O_2$, $Ce_{0.7}Gd_{0.3}O_2$, $Y_{0.15}Zr_{0.85}O_{1.93}$ and $Y_2Si_2O_7$. It is also preferred that the coating contains less than 50 ppm of any trace element, more preferably, less than 20 ppm of any heavy metal, less than 10 ppm of any alkaline metal, and less than 2 ppm of each of Fe, Ni and Cu.

The body is a bare aluminum alloy body, and preferably, the body is an anodized aluminum alloy body. It is also preferred that an outermost surface of the coating has a surface roughness in a range of 80 to 150 µin Ra, wherein a peak to valley ratio, Rp/Rv, of the surface is in a range of 0.30 to 0.60.

It is also preferred that the semiconductor processing member further comprises a bonding layer between the coating and the body to improve a tensile bond strength of the coating, and that the bond layer is selected from the group consisting of (1) Si and (2) co-phased fully stabilized zirconia and $Y_2O_3$.

According to the present invention, the coating reduces contamination of a working wafer in the semiconductor tool so that an amount of Na measured on the wafer is less than $1 \times 10^{14}$ atoms/cm².

According to another aspect of the present invention, a plasma sprayed coating for semiconductor processing members is provided, wherein the coating is selected from the group consisting of solid solutions of $La_2Zr_2O_7$, $La_{1.5}Ce_{0.5}Zr_2O_7$, $Ce_{0.25}Zr_{0.75}O_2$, $Ce_{0.7}Gd_{0.3}O_2$, $Y_{0.15}Zr_{0.85}O_{1.93}$ and $Y_2Si_2O_7$, and wherein the coating imparts both chlorine and fluorine plasma erosion resistance, reduces particle generation during plasma etching, and prevents spalling of the coating during wet cleaning.

Preferably, the coating contains less than 50 ppm of any trace element, and more preferably, the coating contains less than 20 ppm of any heavy metal, less than 10 ppm of any alkaline metal, and less than 2 ppm of each of Fe, Ni and Cu. It is also preferred that an outermost surface of the coating has a surface roughness in a range of 80 to 150 µin Ra, where a peak to valley ratio, Rp/Rv, of the surface is in a range of 0.30 to 0.60.

BRIEF DESCRIPTION OF THE DRAWINGS

The present invention is described in detail herein below in connection with the associated drawing figures, in which.

DETAILED DESCRIPTION OF THE INVENTION

Specific materials that are resistant to fluorine and chlorine chemistries were initially examined to understand their thermodynamic response to the reactions that take place in a semiconductor processing chamber, such as a reactive ion etch (RIE).

Pyrochlores, fluorites and perovskites were analyzed. More specifically, materials from the general families of LaZrO, LaCeZrO, LaGdZrO, YSiO, GdZrO, GdCeO, LaCeO, HfGdO, YbSiO, CeZrO, and CeGdO were examined. In addition, AO-type materials, like $Al_2O_3$, $Y_2O_3$, $Yb_2O_3$ and $HfO_2$ and $ZrO_2$, were also examined as comparative references. It was found that the ABO or ABCO materials, or complex binary or ternary oxides, provided more stable compounds compared to the AO family of simple oxides.

In order to determine which compositions would be the best to use for eventual plasma spay applications, the initial evaluation of materials involved the use of sintered ceramic samples using conventional sintering methods in consideration of the low cost and ease of manufacturing. Sintered ceramic reference or comparative (AO-type oxide material) samples were made, including $Y_2O_3$, $Yb_2O_3$ and $HfO_2$. In addition, sintered ABO-type material test samples were also made, including $Y_{0.15}Zr_{0.85}O_{1.93}$, $Y_2Si_2O_7$, $Yb_2Si_2O_7$, $Ce_{0.25}Zr_{0.75}O_2$, $Ce_{0.7}Gd_{0.3}O_2$ and $La_2Zr_2O_7$.

Commercially available, high purity feedstock powders for each sample composition were mechanically mixed with 3-5 wt % of a polymeric binder, then pressed in the form of a 1 inch diameter samples that were 0.30 inch thick. Each of the pressed samples was fired at 600° C. to burn off the polymeric binder. These samples were then sintered from 1400-1600° C. for 10 to 15 to achieve 95-98% of the theoretical density of each composition, and then cooled in the furnace over a period of 24 hrs. The specific sample compositions were sintered under the following conditions:

$Y_2O_3$ at 1400° C. for 12 hours;
$Yb_2O_3$ at 1400° C. for 10 hours;
$HfO_2$ at 1400° C. for 10 hours;
$Y_{0.15}Zr_{0.85}O_{1.93}$ at 1500° C. for 14 hours;
$Y_2Si_2O_7$ at 1400° C. for 10 hours;
$Yb_2Si_2O_7$ at 1400° C. for 12 hours;
$Ce_{0.25}Zr_{0.75}O_2$ at 1600° C. for 14 hours;
$Ce_{0.7}Gd_{0.3}O_2$ at 1600° C. for 14 hours; and
$La_2Zr_2O_7$ at 1600° C. for 15 hours.

The sintered samples were then ground and polished on both sides to achieve a thickness of 0.24 inch and the surface roughness was at least 2 µin Ra. The samples were cleaned for 10 minutes in an ultrasonic bath filled with deionized (DI) water and then dried in an oven at 85° C. for 2 hrs. All samples were then cooled to room temperature prior to any subsequent testing.

Figure 1:
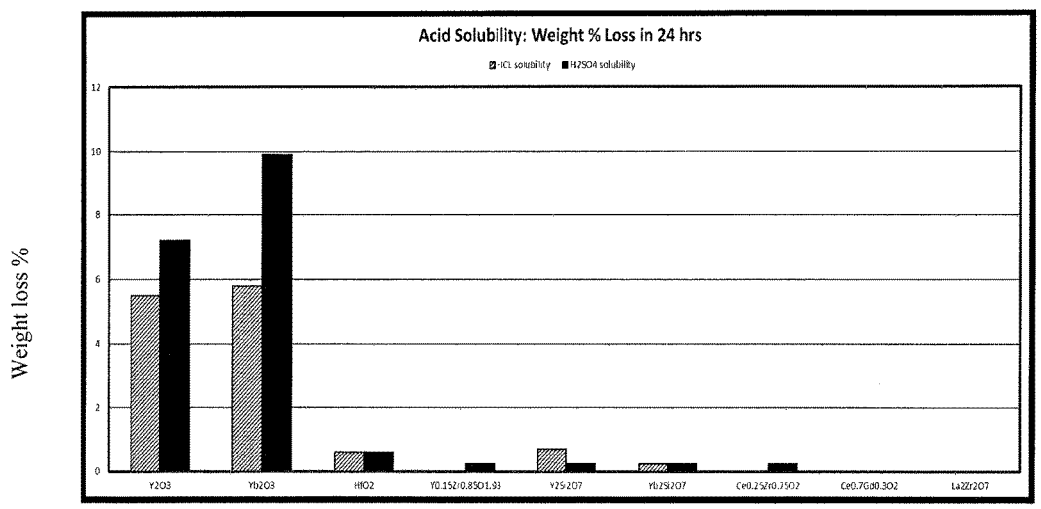
FIG. 1 is a graph showing the acid solubility for the test and comparative sample materials in HCL and $H_2SO_4$ measured over 24 hours as a function of weight % loss.

All of the test and comparative samples were then evaluated for acid solubility in HCL and $H_2SO_4$, which are acids that are commonly used for cleaning semiconductor chamber components. The test and comparative samples were fully immersed in 5 wt % HCl and also in 5 wt % $H_2SO_4$ at room temperature (at 21° C.) for 24 hours, after which time the material loss (in wt %) was measured. FIG. 1 shows the results of the comparative and test materials with respect to the acid solubility. As shown in FIG. 1, this data translates into poor wet cleaning resistance for $Y_2O_3$, the solubility of which in HCl was 6 wt %, and the other AO-type oxides. On the other hand, the ABO-type complex oxides did not show any measurable acid solubility, which translates into good wet cleaning resistance.

Further experiments were done to determine the plasma etch resistance of the test and comparative sample materials. Table 1 shows fluorine chemistries that are widely used for dielectric and conductor etching. $CF_4$ and oxygen plasma were then selected as the etchants for this comparative evaluation of the plasma erosion rate of the select materials. Table 2 shows the experimental conditions that were used according to the present experiment.

TABLE 1

Commonly used Plasma Etch conditions in semiconductor tools.

| Process | Gases | Top RF Power, Watts @ 13.56 MHz | Bottom Bias Power, Watts @ 13.56 MHZ | Process Pressure, mtorr |
|---|---|---|---|---|
| Dielectric Etch | CF4/CHF3/SF6/O2 | 100 to 1200 | 200 to 1000 | 30 to 300 |
| Via Etch | C4F6/CHF3/O2 | 400 to 1000 | 100 to 1700 | 30 to 80 |
| Conductor Etch | Cl2/BCL3/O2 | 500 to 1000 | 100 to 200 | 10 to 20 |

TABLE 2

Experimental Plasma Etch Conditions for the Present Experiments

| Gasses | Top RF Power Watts @13.56 MHZ | Bottom Bias Power Watts @13.56 MHZ | Process Pressure, mtorr |
|---|---|---|---|
| CF4/O2 | 2500 | 250 | 40 |

As described in Table 2, the etch chamber was set to operate at 2500 watts of top RF coil power and a bottom capacitive bias of 250 Watts. RF generators were set to operate at a frequency of 13.56 MHz and the chamber was maintained at a vacuum pressure of 40 mtorr. A flow rate of the ratio of 10 to 1 sccm was maintained for $CF_4$ to $O_2$ to strike the plasma. Each test sample was etched for 30 min. These harsh conditions were selected to in order to accelerate the plasma erosion of the test and comparative sample materials for rapid testing purposes.

Figure 2:
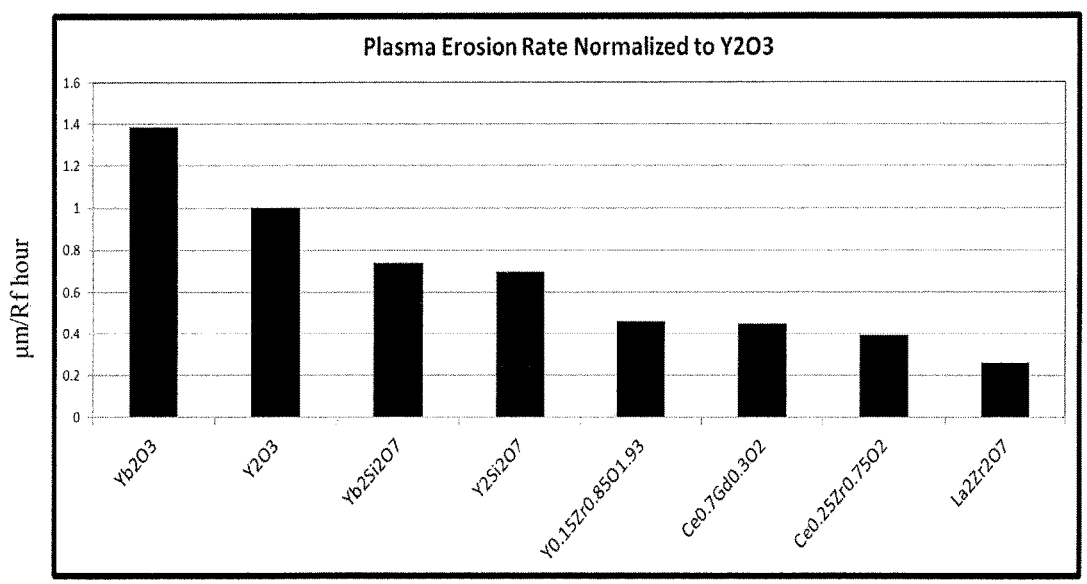
FIG. 2 is a graph showing the plasma erosion rate as a function of thickness loss for the test and comparative materials (Yttria)

After the plasma exposure, the erosion rates of the test and comparative sample materials were measured by recording the thickness loss from the exposed surfaces of the samples. FIG. 2 shows relative plasma erosion rate results of the test and comparative materials, where the plasma erosion of $Y_2O_3$ of 1 μm/Rf hour is used as a reference.

The plasma erosion data shows that the ABO or complex oxide materials have lower plasma erosion rates compared to that of the AO or single oxide-type materials.

EXAMPLES

Further wet corrosion studies and plasma erosion studies identified that ABO-type complex oxide materials provide a better solution for semiconductor processing members with respect to reducing particle generation and improving the number of wet cleaning cycles compared to AO-type single oxides materials that have been used thus far. While the preferred materials according to the present invention can be used as sintered ceramics, where chamber components are made by sintering ceramics, it should be noted that such sintered ceramic components are more expensive and brittle, and that such sintered ceramic parts can break if impacted. In contrast, thermal sprayed coatings made of the complex oxides according to the present invention offer a more robust and economical solution to reduce particles and improve wet cleaning resistance.

The examples below involve thermal spray technology to form protective coatings on substrates (semiconductor chamber component bodies) utilizing the preferred materials according to the present invention.

Comparative Example 1

A mechanically blended powder was made using $La_2O_3$ and $ZrO_2$ in blend ratios to target a pyrochlore phase at 56 wt % $La_2O_3$ with a balance of $ZrO_2$ in a range of 50-60 wt % $La_2O_3$. Coatings were sprayed with a DC plasma arc spray system using Argon and Hydrogen plasma gasses. The formed coatings showed a $La_2Zr_2O_7$ phase and the presence of free $La_2O_3$ and $ZrO_2$. These coatings were tested for plasma erosion, but did not perform as well as compared to the $Y_2O_3$ coatings. These results were undesirable.

Example 1

In view of the undesirable results in Comparative Example 1, powders were then prepared where a solid solution of $La_2O_3$ and $ZrO_2$ was made with $La_2Zr_2O_7$ phase, as verified by X-ray diffraction. Powder samples were prepared using conventional methods of crushing, sieving and spray dry agglomeration to provide an average particle size of 30 μm. The purity of the powder was maintained using powder manufacturing systems lined with plasma sprayed zirconia coatings or polymerics such that all trace elements were less than 50 ppm, all heavy metals were less than 20 ppm, and alkaline metals were less than 10 ppm, as measured by Glow Discharge Mass Spectroscopy (GDMS).

Coatings were made from this $La_2Zr_2O_7$ powder using a DC plasma arc system using argon and hydrogen with an envelope of argon around the plasma plume to form $La_2Zr_2O_7$ coatings. These $La_2Zr_2O_7$ coatings did not show any weight loss when immersed in HCl for 24 hours. These $La_2Zr_2O_7$ coatings were then subjected to an ultrasonic bath of deionized (DI) water at 40 KHz for 15 min, dried in an oven at 85° C. for at least 4 hours, and then tested in the plasma etch chamber and exposed to the fluorine plasma conditions as shown in Table 2. The finish on these $La_2Zr_2O_7$ coatings did not change, and the measured plasma erosion rate was 66% less than that that of the reference $Y_2O_3$ coating.

Figure 3:
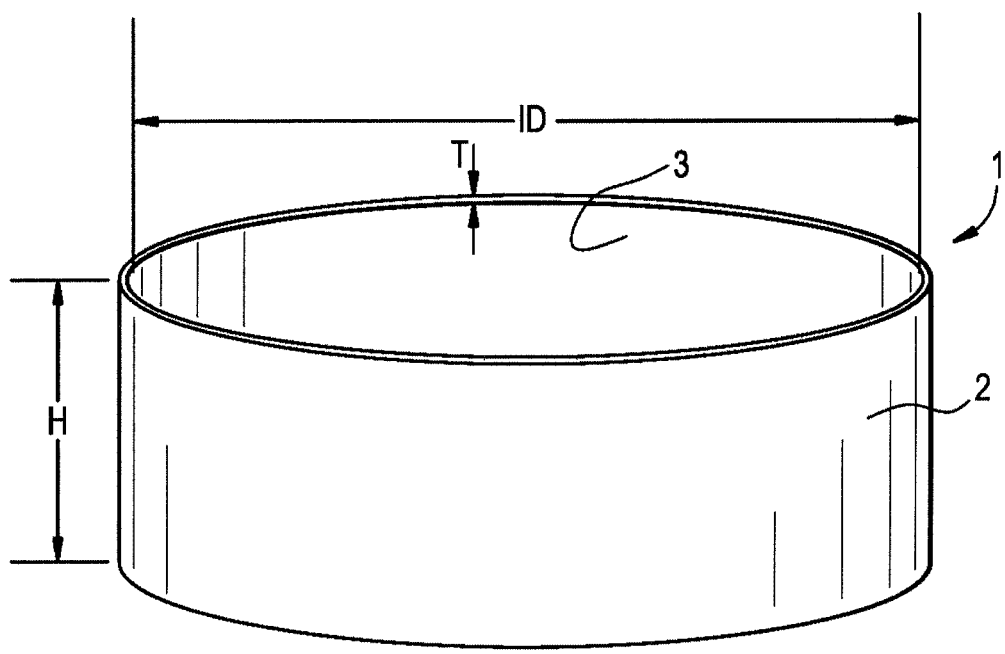
FIG. 3 is a schematic view of a coated cylindrical shell (body) made from 6061 Al alloy representing a commonly used plasma etch chamber shape.

In view of the success of these test samples, a large part was made to represent a shape commonly used in a plasma etch chamber. The part (1) was a cylindrical shell made from 6061 Al alloy and having an inner diameter (ID) of 14 inch and 5 inch height (H), as shown in FIG. 3. The thickness (T) of the cylindrical shell wall was 0.125 inch. The part (1) was grit blasted on the inner diameter surface and then the entire part was hard anodized. The anodization film (2) thickness was about 0.002 inch. A $La_2Zr_2O_7$ coating (3) having a coating thickness of 0.006 inch and made from the high purity, solid solution-formed $La_2Zr_2O_7$ powder described above was then deposited on the inner diameter surface without any further grit blasting. The part was then cleaned in an ultrasonic bath filled with deionized (DI) water for 15 min and then dried in an oven at 85° C. for at least 4 hours. The coated part was placed in a plasma etch chamber to simulate a fluorine dielectric etch environment, and then a chlorine conductor etch environment according to the conditions shown in Table 1. The part was exposed to each of the plasma etch conditions for 15 min for 5 cycles.

When the part was removed from the etch chamber, no erosion was observed on the coated surface. The inner surface of the removed part was wiped with 5 wt % HF and then 5 wt % HCl. The part was then submerged in a DI water ultrasonic cleaner for 10 min and the dried in an oven at 85° C. for at least 4 hours. This cycle of cleaning was repeated 10 times, and no coating delamination from the substrate occurred.

Example 2

The coating from the coated shell used in Example 1 was stripped off using a grit blast method while preserving the anodization. Then the $La_2Zr_2O_7$ coating according to Example 1 was reapplied to restore dimensions of the part. The part was again tested in the plasma etch chamber under the same conditions for 5 times with a cleaning cycle in between the process. The part showed no erosion or delamination of the coating from the substrate.

During the plasma etching processes, Si wafers were also processed, and the contamination levels on the wafers were measured by Mass Spectroscopy using inductively coupled Plasma (MS-ICP). It was found that trace elements on the wafers were less than $10 \times 10^{10}$ atoms/cm$^2$. More importantly, heavy metal elements were less than $5 \times 10^{10}$ atoms/cm$^2$, and alkaline metals were less than $2 \times 10^{10}$ atoms/cm$^2$.

Figure 4:
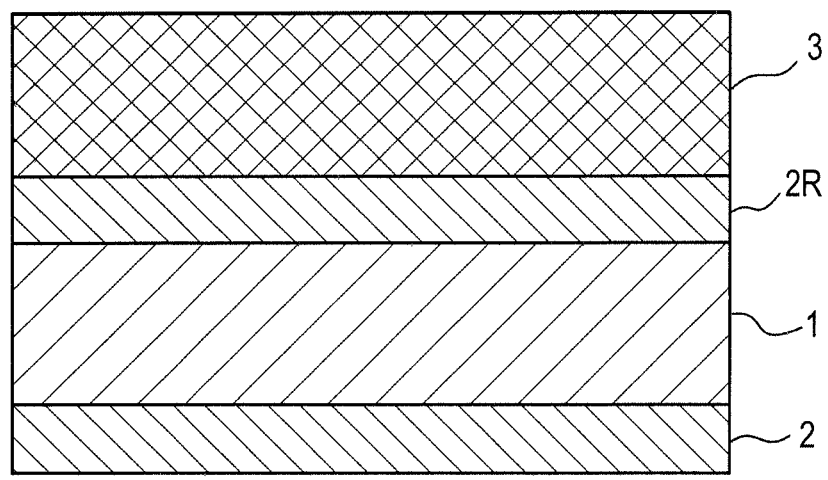
FIG. 4 is a schematic cross-sectional view of a coated chamber component body post-testing.

After the above-described testing, the coated part was sectioned and the coating microstructure was revealed, as schematically shown in FIG. 4. The substrate (body) (1) made of 6061T6 Aluminum has an anodized film (2) on the outer surface thereof. The inner side of the substrate (body) surface was roughened and then anodized; this rough anodized interface (2R) was used to deposit the $La_2Zr_2O_7$ coating (3) without grit blasting. The coating (3) showed no signs of voids within its microstructure, and there was no delamination of the coating from the substrate at interface between the rough anodized interface (2R) and the coating (3), indicating that the coating did not corrode in the chamber or during the wet cleaning process.

The hardness of the coating in cross-section was measured to be in a range of 500 to 600 kg/mm$^2$, and the porosity was measured to be less than 1%.

Example 3

A part having the shape of a cylindrical shell (14 inch ID and 5 inch height) made of 6061 Al alloy was coated in the same manner as described above in connection with Example 1. This time, the surface of the $La_2Zr_2O_7$ coating was textured using a series of flexible pads with backing for diamond coated abrasives. Specifically, 60 μm and then 30 μm diamonds were used as abrasives to texture the coated surface to remove only high spots from the coated surface. This flexible finishing method provided the coated surface with a roughness Ra in a range of 80 to 120 μin. The removal of high spots also provided a peak to valley ratio, Rp/Rv of the surface roughness in a range 0.3 to 0.6.

The part was then cleaned in an ultrasonic bath filled with DI water at 40 KHz at 60° C. for 15 min. Measurement of the particles entrained in the cleaning fluids by a laser particle counter showed a drop of 50% in the total particle count compared to that of Example 1. The part was then dried in an oven at 85° C. for at least 4 hours. The coated part was then placed in a plasma etch chamber to simulate a fluorine plasma etch environment for 30 min. This time, the 200 mm wafers that were also simultaneously processed were examined to determine the number of particles landing thereon. Only one particle was detected in a run where 10 wafers were processed.

Example 4

To further confirm the validity of using complex oxides for plasma erosion application in semiconductor tools, a powder of the composition $Ce_{0.25}Zr_{0.75}O_2$ as a solid solution was made using high purity materials, where the content of heavy metals was less than 20 ppm, the content of alkaline metals was less than 5 ppm, and the content of Fe, Cu or Ni was less than 5 ppm each. The powders of the composition had an average particle size of 20 μm. The powder was sprayed with a DC plasma spray system, using argon and hydrogen, with an envelope of argon around the plasma plume to minimize entrainment of air into the effluent. Free standing $Ce_{0.25}Zr_{0.75}O_2$ coatings were made and then different samples were immersed in one of HCL and $H_2SO_4$ for 24 hours. These $Ce_{0.25}Zr_{0.75}O_2$ coatings did not show any significant weight loss in either acid exposure test. Samples of $Ce_{0.25}Zr_{0.75}O_2$ coatings exposed to fluorine plasma for 30 min showed 60% less erosion as compared to the reference $Y_2O_3$ coating.

Example 5

Powder was also made of $Ce_{0.7}Gd_{0.3}O_2$ as a solid solution (hereinafter GDO powder), where the average particle size was 30 μm. The GDO powder was a high purity content to maintain all trace elements to less than 50 ppm, as verified by GDMS. Free standing coatings were made with the CGO powder, and when the coatings were immersed in HCL and $H_2SO_4$ for 24 hours, no weight loss was measured. Samples of the GDO coatings exposed to fluorine plasma for 30 min showed 58% less plasma erosion compared to the reference $Y_2O_3$ coating.

Example 6

A first set of 3 cylindrical test samples having a diameter of 1 inch and a length of 1.5 inch were made of 6061 Al alloy. Bare Al alloy coupons were grit blasted on the 1 inch diameter face, and a $La_2Zr_2O_7$ solid solution coating of 0.012 inch thickness was deposited on the grit blasted surface by the plasma spray coating process described in connection with Example 1. The tensile bond strength of the coating was measured according to the ASTM C633 standard method, and was determined to be an average of 8,900 psi.

Another set of 3 cylindrical samples were grit blasted and then anodized (hereinafter referred to as anodized Al alloy coupons). A $La_2Zr_2O_7$ solid solution coating of 0.012 inch thickness was deposited on the 1 inch diameter face. The tensile bond strength of the coating was measured to be an average of 7,900 psi.

The bare Al alloy and anodized Al alloy samples having the coatings thereon were cycled to 300° C. 10 times. It was found that the tensile bond strength of the coating on the anodized Al alloy surfaces was reduced by 5%, whereas for bare Al alloy surfaces, the tensile bond strength of the coating was reduced by 30% under the same conditions.

Another set of bare and anodized Al alloy test samples were first coated with an Si bond coating layer, and then with the $La_2Zr_2O_7$ coating. The test samples were then cycled 10 times from room temperature to 300° C., and then the tensile bond strength of the test samples was measured. These samples did not show any significant decrease in tensile bond strength of the coating.

Figure 5:
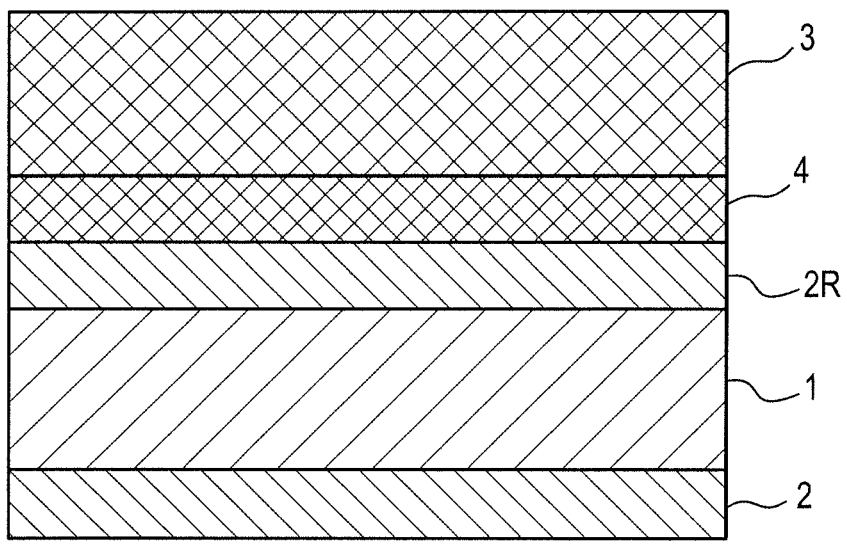
FIG. 5 is a schematic cross-sectional view of a coated component member (body) including a bonding layer.

Another set of samples were prepared, both with and without bond layers, as described in more detail below. A cross-section of a sample including a bonding layer 4 is shown schematically in FIG. 5. This sample (1) was first roughened on one side and then anodized on all surfaces. The anodization on the non-roughened surface is shown as (2) and the roughened interface is shown as (2R). Then a bond layer (4) was deposited. This time, the bond layer coating (4) was made of a co-phase of fully stabilized zirconia (FSZ) and $Y_2O_3$ coating, where $Y_2O_3$ was 18 wt. %. Then a top layer coating (3) of $La_2Zr_2O_7$ was deposited on the bond layer (4). Both of these samples were cleaned with HCl and then immersed in DI water in an ultrasonic tank for 5 minutes. These samples were then tested for tensile bond strength. It was found that the test samples with bond layer showed no decrease in bond strength, whereas the test samples without a bond layer showed a 25% decrease in bond strength.

Example 7

It is critical to maintain the purity of the coatings in semiconductor chambers in order to maintain the functionality of the transistor devices that are formed in such processing chambers. To understand the purity of the formed coatings, a set of 4×4×0.125 inch coupons were coated with a $La_2Zr_2O_7$ solid solution coating. The surfaces were examined by GDMS after laser ablation of the surface in successive steps, where the coating was removed by rastering a laser beam on the coated surface and the coated surface was ablated in steps to a depth of 0.001 inches and then the trace elements of each exposed coating surface layer were measured by GDMS. This measurement method showed that through the thickness of these coatings, that there were no trace metal elements in excess of 20 ppm (i.e., less than 10 ppm, and for critical elements of Na, K, Mg, Fe, Cr and Ni, and less than 5 ppm or even less than 2 ppm for Fe, Ni and Cu).

Example 8

A solid solution powder was made with a $La_{1.5}Ce_{0.5}Zr_2O_7$ phase, where the average particle size of the powder was 20 µm. Coatings were made using the plasma spraying methods according to Example 1. A set of samples, hereinafter referred to as bend strips, being 6 inch in length, 1 inch in width and 0.125 inch in thickness, made of 6061T6 Aluminum alloy, were coated with $La_{1.5}Ce_{0.5}Zr_2O_7$ coatings of 0.004 inch thick. Reference samples were also made having the same dimensions and coated with $La_2Zr_2O_7$ solid solution coatings of the same thickness. These bend strips were bent in a fixture around a mandrel of 0.5 inch diameter. It was found that the $La_2Zr_2O_7$ coatings started cracking and spalling from the substrate earlier than the $La_{1.5}Ce_{0.5}Zr_2O_7$ coatings during this bend test, which indicated an increase in ductility and adhesion strength of the $La_{1.5}Ce_{0.5}Zr_2O_7$ coating due to the ternary phase formation in the presence of $CeO_2$ as verified by x-ray diffraction.

Example 9

Figure 6:
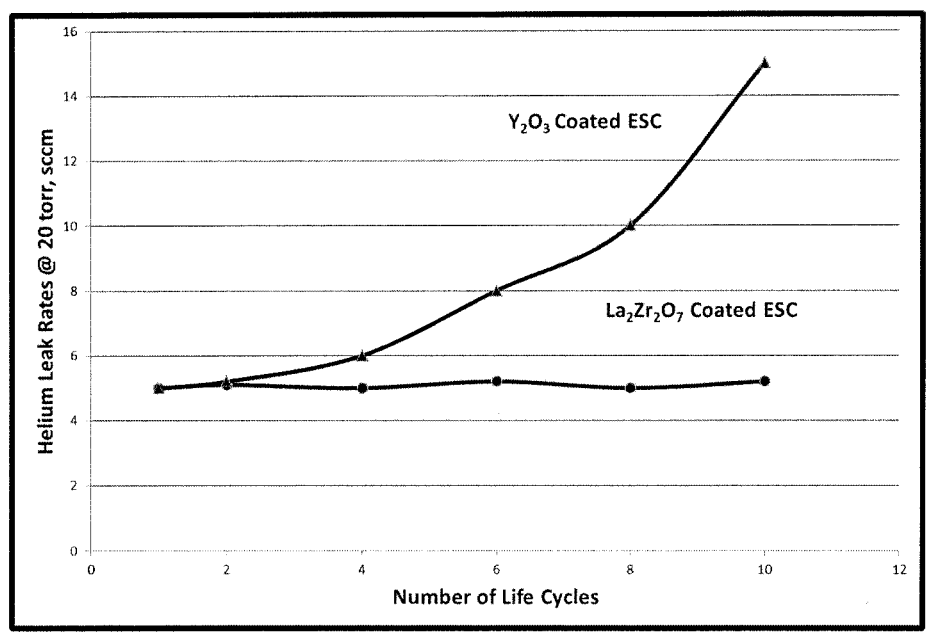
FIG. 6 is a graph showing the helium leak rate at 20 torr versus the life cycle of coated electrostatic chucks.

An electrostatic chuck (ESC) coated with $Y_2O_3$ that showed surface erosion and higher helium leak rates when used in a chlorine plasma etch environments was obtained. The chuck surface was provided with a $La_2Zr_2O_7$ solid solution coating on the surfaces that are exposed to plasma conditions for dielectric etching. The chuck was used again in the plasma chamber under the same conditions, and showed no erosion of the surfaces that were protected with the $La_2Zr_2O_7$ coating, and the electrostatic chuck continued to provide electrostatic clamping to a working substrate with very stable helium leak rates. FIG. 6 shows that there was no increase in backside gas leak rates due to higher erosion resistance of the sealing surfaces of the ESC coated with $La_2Zr_2O_7$ as compared to the one coated with $Y_2O_3$. Use of the high purity, solid solution $La_2Zr_2O_7$ coatings also resulted in very little transfer of trace elements to the wafer. Trace elements of heavy metals like Cr, Fe, Ni and Cu were less than $1\times10^{12}$ atoms/cm², and Na was less than $1\times10^{14}$ atoms/cm², as measured by Mass Spectroscopy using Inductively Coupled Plasma instrumentation (MS-ICP).

Example 10

A sintered ceramic part made from $Al_2O_3$ that showed an excessive formation of $AlF_3$ particles in a plasma chamber was coated with 0.004 inches of a $Ce_{0.7}Gd_{0.3}O_2$ solid solution coating. The coated part, when installed in a semiconductor etch tool in the plasma zone did not show any formation of $AlF_3$ particles when exposed to fluorine plasma. A polymer film, which is a byproduct of the fluorine etching process, begins to build up as soon as Rf exposure begins and was deposited on the part. After about 100 Rf hours, the buildup is measurable and requires removal. The part was removed from the chamber, the $Ce_{0.7}Gd_{0.3}O_2$ coating was removed by grit blasting, and then a new coating layer was applied to restore the part to full functionality.

The various examples above illustrate the use of complex oxide coatings to prevent plasma erosion of various components used in semiconductor processing members.

While the present invention has been particularly shown and described with reference to the preferred mode as illustrated in the drawings, it will be understood by one skilled in the art that various changes in detail may be effected therein without departing from the spirit and scope of the invention as defined by the claims.

What is claimed is:

1. A semiconductor processing member comprising:
a body; and
a plasma spray coating provided on said body;
wherein said plasma spray coating is an ABO or ABCO complex oxide solid solution composition selected from the group consisting of $La_2Zr_2O_7$, $La_{1.5}Ce_{0.5}Zr_2O_7$, $Ce_{0.25}Zr_{0.75}O_2$, $Ce_{0.7}Gd_{0.3}O_2$, and $Y_{0.15}Zr_{0.85}O_{1.93}$;
whereby said plasma spray coating imparts both chlorine and fluorine plasma erosion resistance, reduces particle generation during plasma etching, and prevents spalling of said plasma spray coating during wet cleaning of said member.

2. The semiconductor processing member according to claim 1, wherein said plasma spray coating contains less than 50 ppm of any trace element.

3. The semiconductor processing member according to claim 2, wherein the plasma spray coating contains less than 20 ppm of any heavy metal, less than 10 ppm of any alkaline metal, and less than 2 ppm of each of Fe, Ni and Cu.

4. The semiconductor processing member according to claim 1, wherein the body is a bare aluminum alloy body.

5. The semiconductor processing tool according to claim 1, wherein the body is an anodized aluminum alloy body.

6. The semiconductor processing member according to claim 1, wherein an outermost surface of said plasma spray coating has a surface roughness in a range of 80 to 150 µin Ra, wherein a peak to valley ratio, Rp/Rv, of said surface is in a range of 0.30 to 0.60.

7. The semiconductor processing member according to claim 1, further comprising a bonding layer between the plasma spray coating and the body to improve a tensile bond strength of said coating.

8. The semiconductor processing member according to claim 7, wherein said bonding layer is selected from the group consisting of (1) Si and (2) co-phased fully stabilized zirconia and $Y_2O_3$.

9. The semiconductor processing member according to claim 1, wherein said plasma spray coating reduces contamination of a working wafer in the semiconductor tool so that an amount of Na measured on the wafer is less than $1\times10^{14}$ atoms/cm$^2$.

10. A semiconductor processing member comprising:
a body comprising one of a bare aluminum alloy body and an anodized aluminum alloy body;
a plasma spray coating provided on the body; and
a bonding layer between the plasma spray coating and the body to improve a tensile bond strength of the plasma spray coating, wherein the bonding layer is selected from the group consisting of (1) Si and (2) co-phased fully stabilized zirconia and $Y_2O_3$;
wherein the plasma spray coating is an ABO or ABCO complex oxide solid solution composition, where A, B and C are selected from the group consisting of La, Zr, Ce, Gd, Y, Yb and Si, and O is an oxide; and
whereby the plasma spray coating imparts both chlorine and fluorine plasma erosion resistance, reduces particle generation during plasma etching, and prevents spalling of the plasma spray coating during wet cleaning of the member.

11. The semiconductor processing member according to claim 10, wherein the plasma spray coating is selected from the group consisting of $La_2Zr_2O_7$, $La_{1.5}Ce_{0.5}Zr_2O_7$, $Ce_{0.25}Zr_{0.75}O_2$, $Ce_{0.7}Gd_{0.3}O_2$, $Y_{0.15}Zr_{0.85}O_{1.93}$ and $Y_2Si_2O_7$.

12. The semiconductor processing member according to claim 10, wherein the plasma spray coating contains less than 50 ppm of any trace element.

13. The semiconductor processing member according to claim 12, wherein the plasma spray coating contains less than 20 ppm of any heavy metal, less than 10 ppm of any alkaline metal, and less than 2 ppm of each of Fe, Ni and Cu.

14. The semiconductor processing member according to claim 10, wherein an outermost surface of the plasma spray coating has a surface roughness in a range of 80 to 150 µin Ra, wherein a peak to valley ratio, Rp/Rv, of the surface is in a range of 0.30 to 0.60.

15. The semiconductor processing member according to claim 10, wherein the plasma spray coating reduces contamination of a working wafer in the semiconductor tool so that an amount of Na measured on the wafer is less than $1\times10^{14}$ atoms/cm$^2$.

* * * * *